US005468298A

United States Patent [19]
Lei et al.

[11] Patent Number: 5,468,298
[45] Date of Patent: Nov. 21, 1995

[54] BOTTOM PURGE MANIFOLD FOR CVD TUNGSTEN PROCESS

[75] Inventors: Lawrence C. Lei, Milpitas; Cissy Leung, Fremont, both of Calif.

[73] Assignee: Applied Materials, Inc., Santa Clara, Calif.

[21] Appl. No.: 226,907

[22] Filed: Apr. 13, 1994

[51] Int. Cl.$^6$ .................................................. C23C 16/00
[52] U.S. Cl. ............................ 118/728; 118/715; 118/725
[58] Field of Search ................................... 118/715, 725, 118/728; 156/345

[56] References Cited

U.S. PATENT DOCUMENTS

5,000,113  3/1991  Wang ........................................ 118/715

*Primary Examiner*—Richard Bueker
*Attorney, Agent, or Firm*—Janis Biksa; Charles S. Guenzer

[57] ABSTRACT

A bottom purge manifold for the gas purge channel of a CVD semiconductor processing chamber provides an obstruction in the purge gas flow from a purge gas passage to the central portion of the processing chamber. The gas flow is restricted by a ring having generally equally spaced holes therethrough obstructing the purge channel opening and retained in the channel by spring loaded retaining flanges. A set of fan-shaped slots carry the purge gas from the openings and direct it towards the center portion of the processing chamber. This manifold produces a generally uniform flow from the gas purge manifold to improve the uniformity of vapor deposition on the wafer's surface.

15 Claims, 8 Drawing Sheets

BOTTOM PURGE MANIFOLD FOR CVD TUNGSTEN PROCESS

FIELD OF THE INVENTION

This invention relates to improved gas distribution in chemical vapor deposition (CVD) processing chambers.

BACKGROUND OF THE INVENTION

Figure 1:
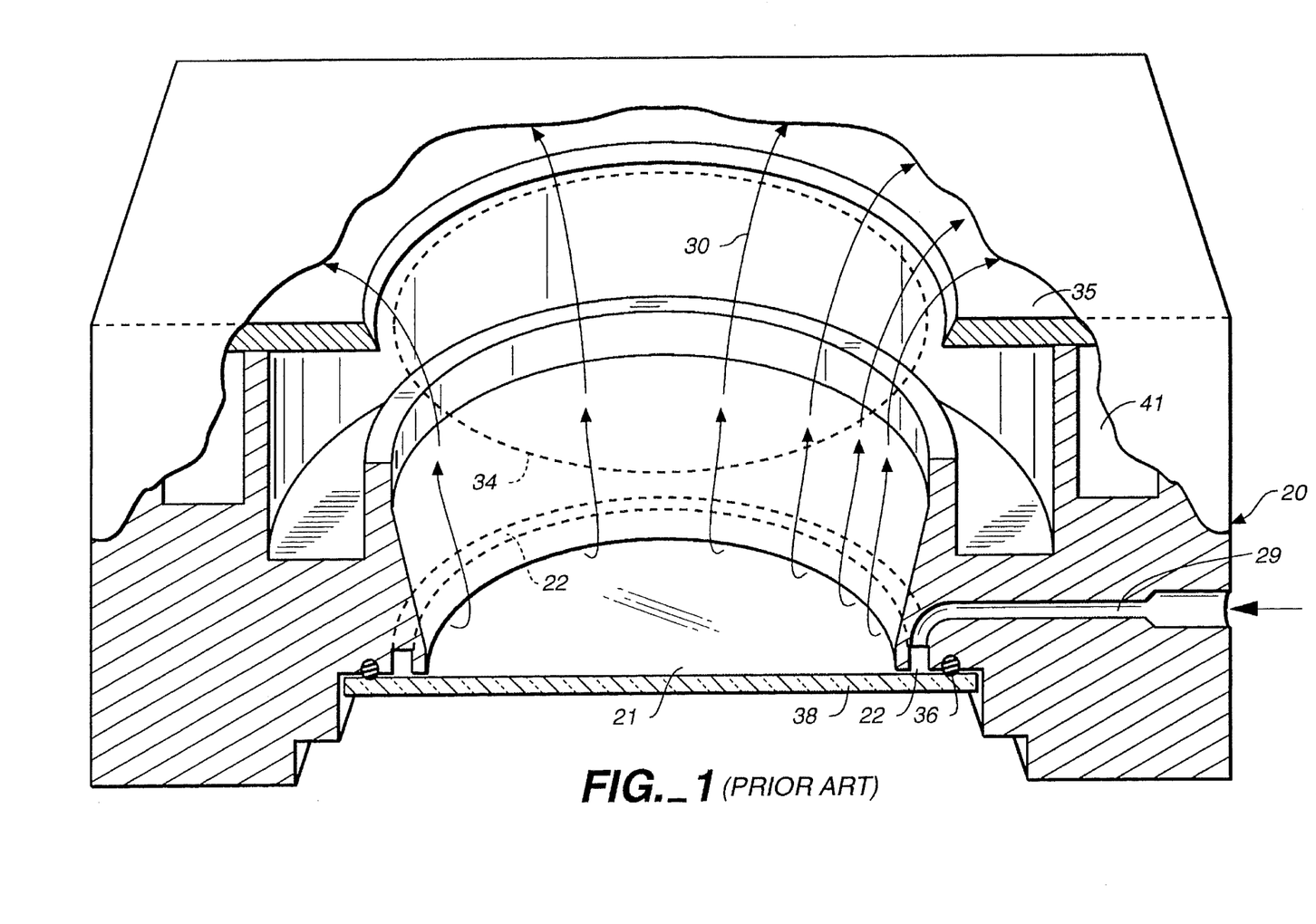
FIG. 1 is a cross-sectional perspective view of a prior art processing chamber.
Figure 2:
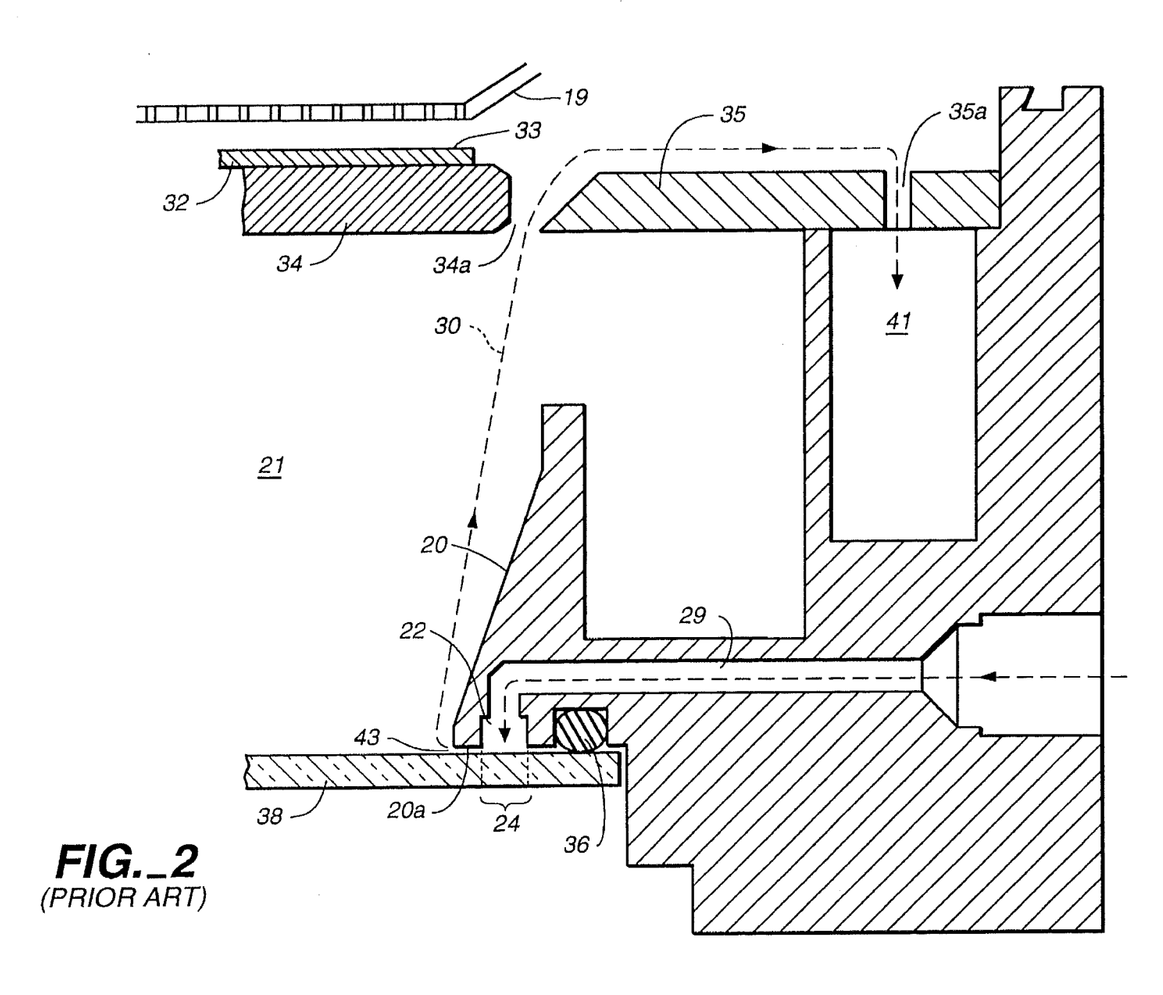
FIG. 2 is a close up cross-sectional view of the chamber bottom purge channel of FIG. 1.

When wafers are undergoing semiconductor processing in a CVD-type processing chamber 20, as shown in FIGS. 1 and 2, a susceptor 34 faces a gas distribution plate 19 through which process gas flows. Gas products deposit on a wafer 32 supported by the susceptor 34. To prevent the process gas from leaking around the wafer and susceptor 34, a pumping plate 35 closely surrounds the susceptor opening. A circular gap 34a exists between the pumping plate 35 and the edge of the susceptor 34. To prevent process gas from migrating down through this circular slot or gap to coat the backside of the susceptor, purge gas is introduced below the susceptor 34 to flow upward through the slot 34a. The purge gas is distributed around a center portion 21 of the processing chamber in a circumferential chamber purge channel 22 which faces a fused quartz window 38 through which light is transmitted for heating the back of the susceptor 34. The quartz window 38 is placed against the bottom of the processing chamber 20 and is sealed to it by an O-ring seal 36.

During processing, purge gas flows into a purge gas feed passage 29 from outside the processing chamber. This purge gas feed passage 29 terminates in the chamber purge channel 22 (FIG. 2). The purge channel 22 describes an annular ring shaped passage around the edge of the fused quartz window 38. As purge gas passes into the purge channel 22, it passes along the circumferential path of the channel and through the opening of the slotted orifice 43 between the fused quartz window 38 and the inner wall of the chamber purge channel 22. The gas then flows up towards and through the gap 34a between the susceptor 34 and the pumping plate 35 and flows towards holes 35a in the pumping plate until it reaches a pumping channel 41 (FIG. 2). The pumping channel 41 is connected to the vacuum system which evacuates the processing chamber during processing.

The gap 43 between the processing chamber wall 20a adjacent to the chamber purge channel 22 and the surface of the fused quartz window 38 describes a circular slot. A continuous circular orifice between the chamber purge cell 22 and the center portion of the processing chamber 21. The size of this gap 43 can depend on the resiliency of the O-ring seal 36 or may be set by a teflon seal 66 such as shown in FIG. 5A. However, with a long, continuous orifice fed only at one point gas distribution through the slot along the slot may vary even with a constant purge flow because of the nature of the flow; sometimes it is necessary to change process gas flows and pressures for different processes which can vary the purge gas flow pattern unpredictably. Similarly purge gas flows must be changed to assess and utilize more efficient processing protocols. So, while one particular slot opening will work at a particular flow rate and pressure differential, a change in the flow rate or a change in the pressure differential can adversely and unpredictably affect the location at which gas molecules exit the chamber purge channel 22 and flow into the central portion 21 of the processing chamber 20.

A purge flow whose flow rate has been reduced such that uniform pressure is not found in the chamber purge channel at all locations around its circumference can produce a flow pattern similar to that which is visually depicted in FIG. 1. The arrows 30 can be understood to be nearly equal units of gas flow. Substantially more gas flow occurs closely adjacent to the location of the purge gas feed passage 29 (indicated by the greater numbers of arrows close to the feed passage) and less gas flows (the gas flow arrows 30 being spaced farther apart) from the orifice at process chamber locations opposite the purge gas feed passage 29. The flow as described and depicted in FIG. 1 tends to produce a distortion in the process gas flow as the purge gas tends to displace the process gas non-uniformly at predetermined gas flows. Distortion of the process gas flow pattern reduces the uniformity of the deposited material on a wafer surface requiring extra coating thickness allowances to overcome such non-uniformities.

SUMMARY OF THE INVENTION

This invention provides a solution to the above-described problem. This invention provides a ring obstructing the channel purge chamber and provides only discrete limited passages between the inside of the purge channel and the interior of the processing chamber. These sets of passages can consist of several discrete small openings, generally equally distributed around the circumference of a ring which obstructs the chamber purge channel opening. These passages can be at the center or edge of the obstruction. The passages can be orifices that are circularly shaped or have other shapes. In one instance they are distributed evenly around the circumference of the purge channel with no orifice directly opposite the end of the purge gas feed passage.

In one configuration, the obstruction includes a flat ring which covers the chamber purge channel. The ring laps onto a first surface adjacent to an inside edge of the bottom purge channel opening and has a second flange that laps onto a second surface adjacent to an outside edge of the bottom purge channel opening. The orifices in the ring can be centered in the ring. A retaining mechanism can be provided which can include several fingers that extend into the chamber purge channel to act as retaining clips for the ring. The retaining mechanism may be a set of retaining flanges (or clips) configured to be spring-loaded against the walls of the purge channel when the ring is put in position.

In another configuration, the retaining flanges may have bulges on the retaining flanges facing the walls of the purge channel, such that only the bulges touch the walls of the purge channel. The retaining flanges are configured to be springingly urged against the walls of the purge channel to help retain the ring in the channel and help prevent gas from leaking from the inside of the purge channel to the inside of the processing chambers through paths other than the gas passageways or orifices provided.

In another configuration, the ring and its adjacent flanges have a generally uniform continuous top surface from edge to edge, and at each orifice location, a fan-shaped slot with the orifice at the axis of the fan assists in directing the purge gas flow towards the center portion of the processing chamber and provides flow resistance to gas flow in directions other than towards the center portion of the processing chamber. In this configuration, it is possible to place the fused quartz window directly against the purge gas manifold as the fan-shaped slotted passages will permit the gas to flow from the purge channel through the slotted orifices even when the fused quartz window is tightly sealed against the ring. The fan-shaped slot is provided in a central thick portion of the rings so that structural integrity of the ring is maintained.

These configurations of the invention as described provide generally uniformly spaced orifices around the circumference of the processing chamber, such that during blanket tungsten and selective tungsten deposition processes in such chambers, improved deposition uniformity across the wafer being processed results.

DETAILED DESCRIPTION

Non-uniform deposition on a wafer surface occurs when the process gas flow patterns (regimes) in a processing chamber do not evenly distribute the process gas or when process gas distribution is disrupted or unevenly influenced by purge gas flows in the chamber. Such non-uniformity must be accounted for when processing conditions and times (protocols) are set. Ideally a predetermined quantity of gas is uniformly distributed through a parallel slot orifice (FIG. 1) whose size is known. Such an ideal flow would provide a predetermined purge flow around the gap 34a between the susceptor 34 and the pumping plate 35. However, in reality, one processing chamber is used for many variations of a single process. Therefore, while an average orifice opening size can be designed into the processing chamber, different types of processes in the processing chamber require adjusting the process gas and purge gas flow rates accordingly. Such variation causes uneven distribution of purge gas flow and can prevent a process from being tuned when flow patterns are lopsided and generally not uniform.

Figure 4:
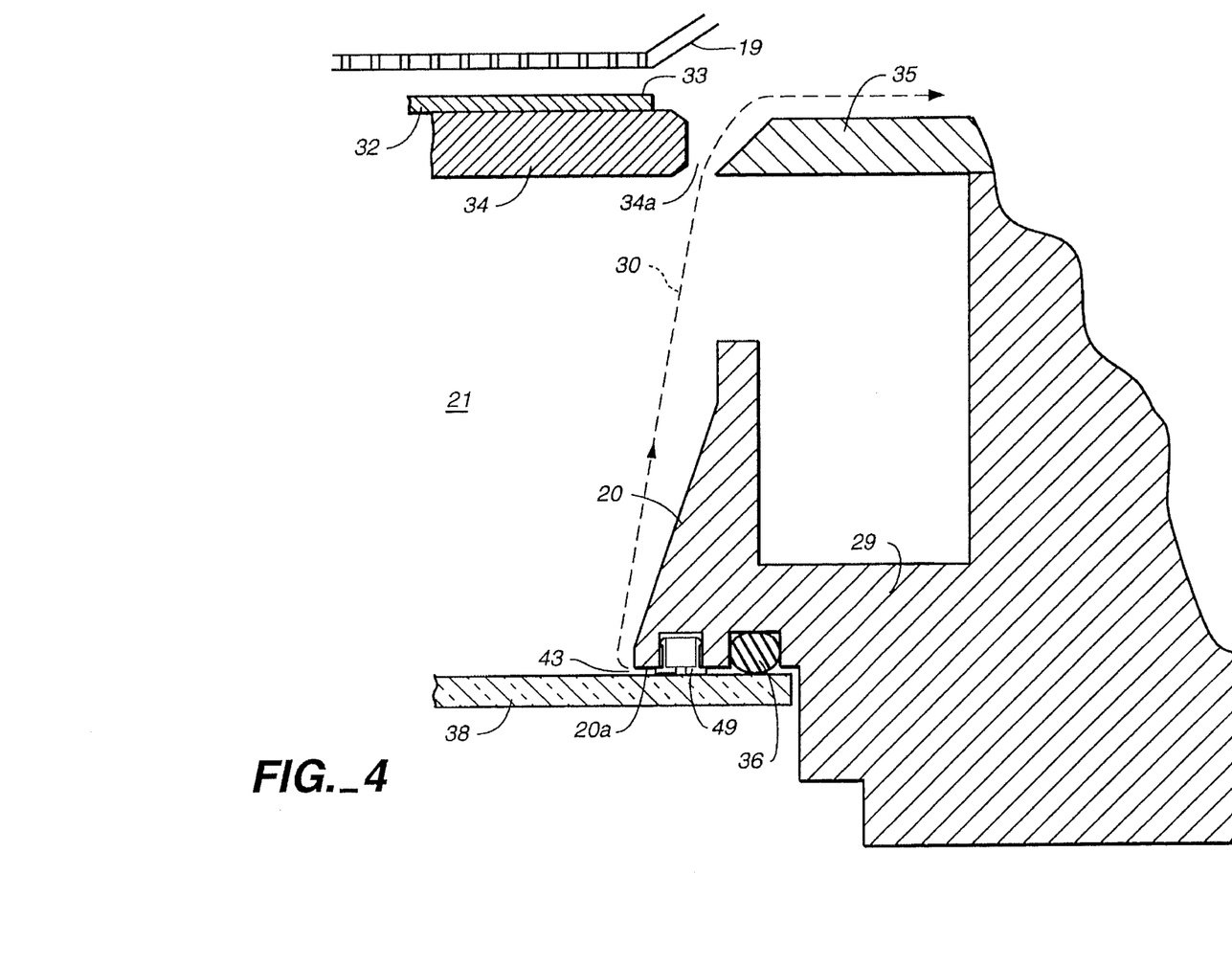
FIG. 4 is a close up of FIG. 3.
Figure 6:
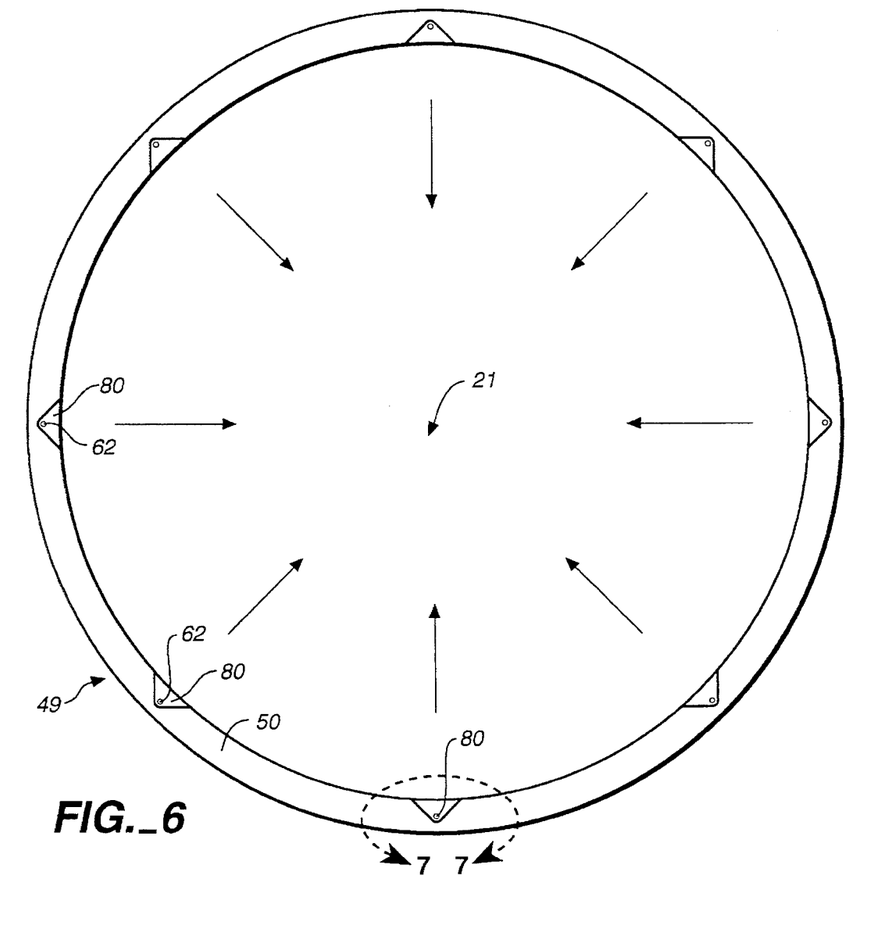
FIG. 6 shows a plan bottom view of a bottom purge manifold according to the invention.

The chamber purge channel 22 as shown in FIGS. 1 and 2 has its opening obstructed by a bottom purge manifold 49 (FIG. 4). The bottom purge manifold 49 shown in a bottom view in FIG. 6 is an annular ring 50 which covers the chamber purge channel 22 and channel opening 24 (as seen in FIG. 2) to provide a series of predefined passages (in this case holes or apertures 62) evenly distributed around the circumference of the ring 50 (FIGS. 6 and 7).

Figure 3:
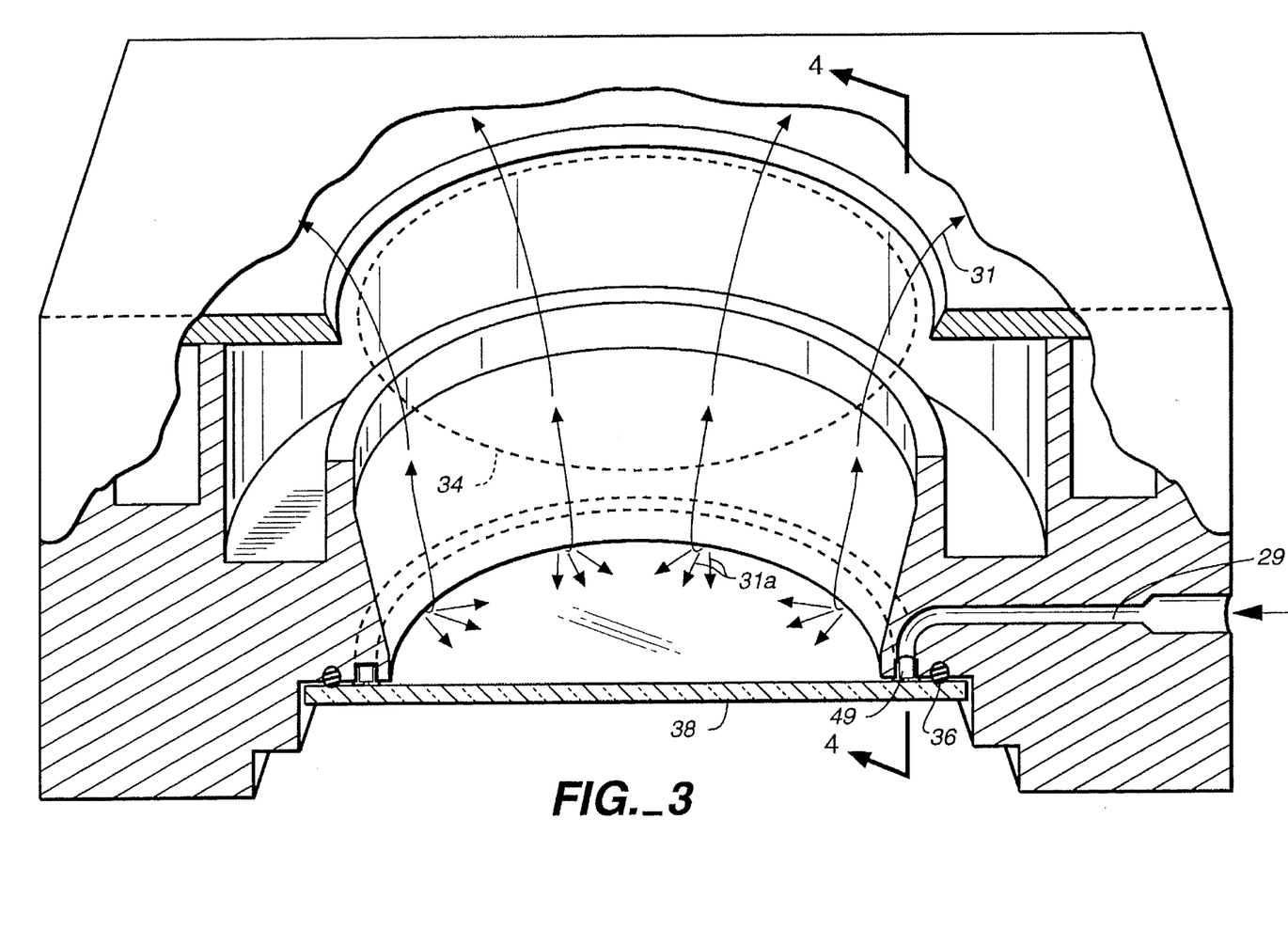
FIG. 3 is a perspective cross-sectional view of a processing chamber including a bottom purge manifold according to the invention.
Figure 5:
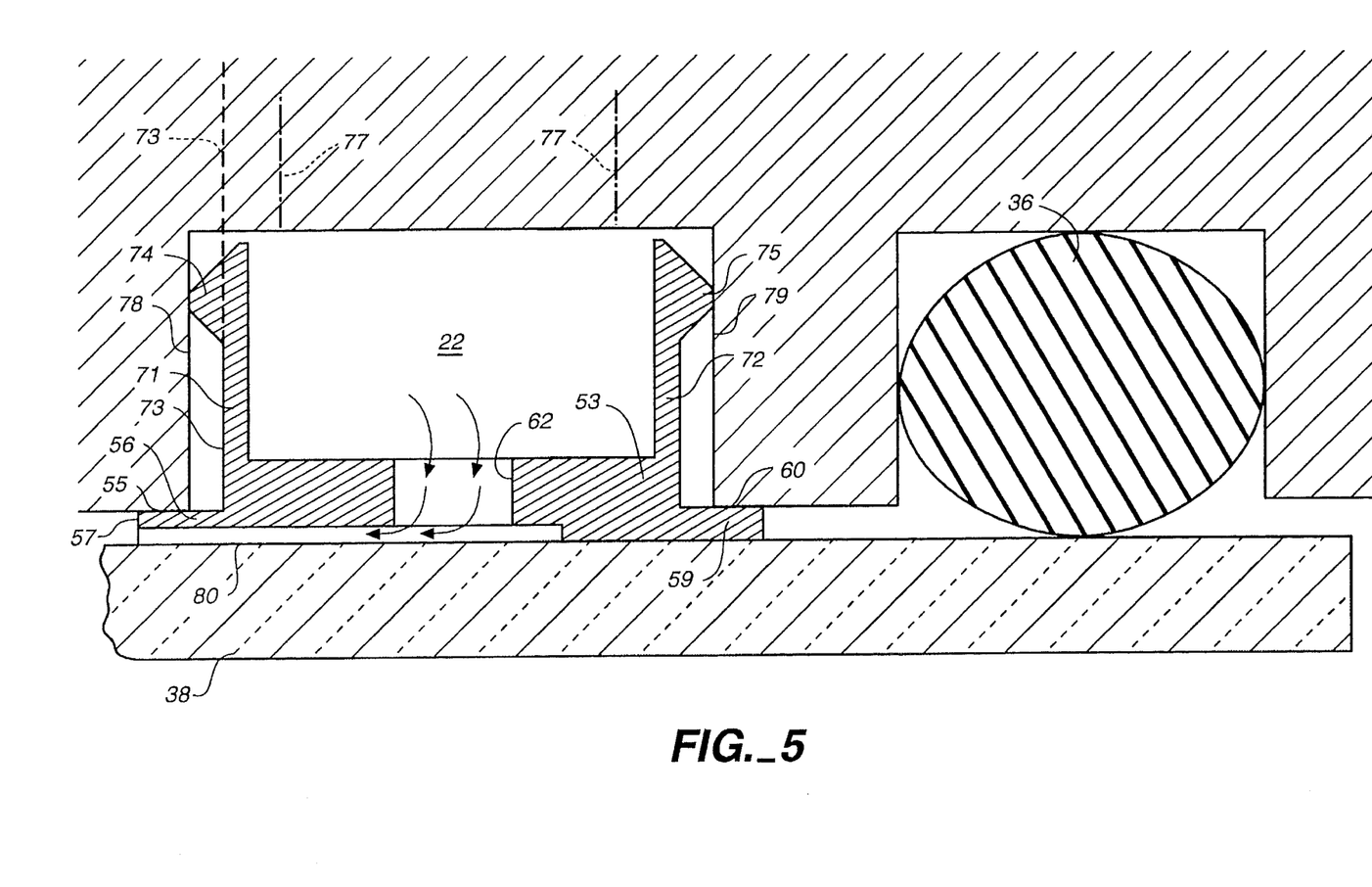
FIG. 5 is an extreme close up of one configuration of a cross-section of a bottom purge manifold according to the invention.
Figure 5A:
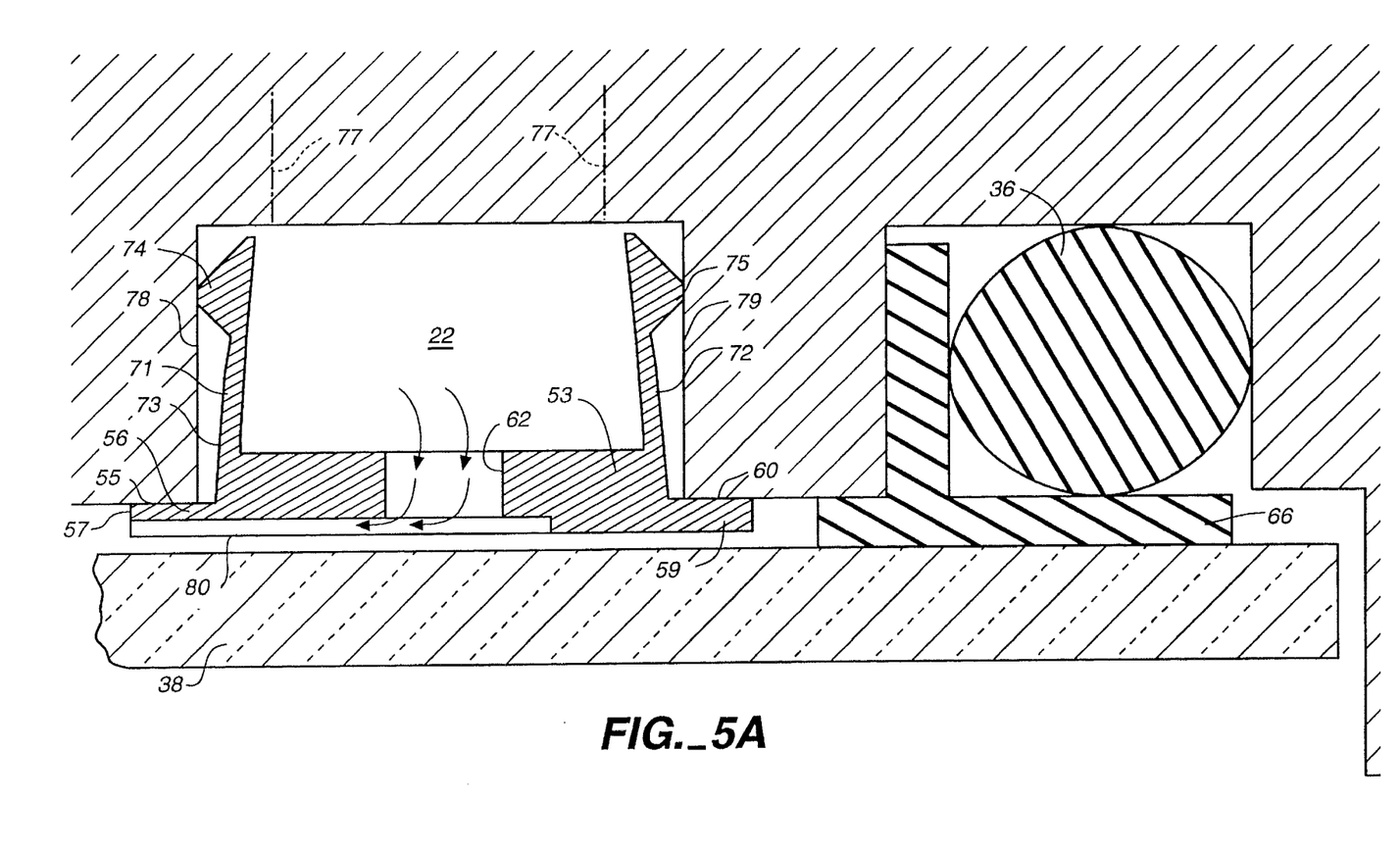
FIG. 5A shows a cross-sectional view of a different configuration according to the invention, similar to that shown in FIG. 5.

When the bottom purge manifold 49 is in place opposite the fused quartz window 38, which is sealed by an O-ring 36 as shown in both FIGS. 4 and 5, a fan-shaped opening or slot 80 (FIGS. 5, 6 and 7) provides an enlarged opening which directs the flow of purge gas towards the center portion 21 of the processing chamber 20. The arrows shown in FIG. 6 show the direction of flow towards the center portion 21. As can be seen in FIG. 3, the distribution of purge gas from the bottom purge manifold 49 results in a localized gas flow distribution adjacent to the bottom purge manifold as shown by the sets of arrows 31a in FIG. 3. This localized gas flow, which is evenly distributed about the chamber purge channel 22, results from the fact that the size of the orifice, in this example 0.056" (1.42 mm) in diameter, creates sufficient resistance at a flow of 500 sccm of Ar when the total process gas flow is approximately 2375 sccm (consisting of Ar, $WF_6$, and $H_2$) with process conditions of approximately 80 Torr and 475° C. With a wafer diameter of approximately 200 mm, the flow regime as shown is in general equally distributed by the arrows designated as 31 in FIG. 3.

Figure 7:
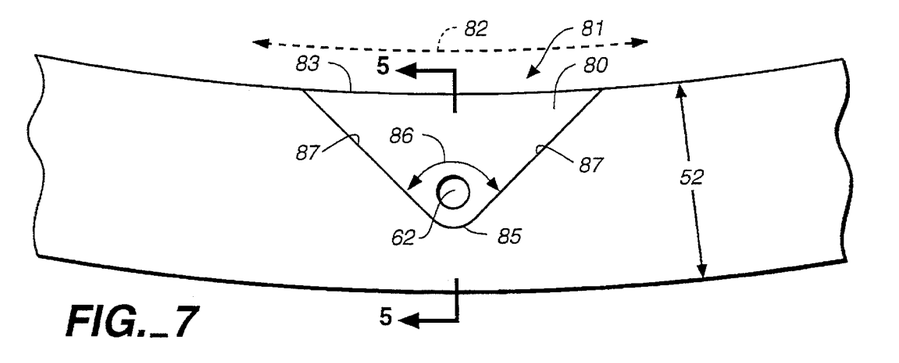
FIG. 7 shows a close up of FIG. 6 taken at 7—7; with several additional parameters identified.

The configuration of the fan-shaped slot 80 is as shown in FIGS. 7 and 7A. An orifice 62 passes through a central thick portion 53 (FIG. 5) of the continuous top surface 52 between the extreme inner and outer edges of the flanges adjacent to the thick center portion 53. The hole 62 passing through this thick portion opens into a top section of the triangular (fan-shaped) slot 80. The slot 80 approximates an isosceles triangle 81 formed from two equal legs 87 of the triangle set at a predetermined angle 86 from one another, having an imaginary base 83 parallel to a circumferential path 82 circumscribing the ring. The predetermined angle is generally 90° and the slot has a depth of approximately 0.009" (0.229 mm).

A cross-section of the bottom purge manifold 49 as installed is shown in FIG. 5 which is also a cross-section 5—5 from FIG. 7. The quartz fused window 38 presses directly on the outside of (with respect to the center line of the processing chamber) the continuous top surface 52 of the ring 50. The ring 50 covers the opening 24 (FIG. 2) having inside and outside walls 78, 79. The ring 50 includes a central thick portion 53 as well as an inner flange 56 which laps onto a first surface 55 adjacent to an inside edge of the purge channel 22. The flange 56 includes a center-facing surface (inner circumferential surface of the ring) 57 facing the central portion 21 of the processing chamber 20.

Figure 8:
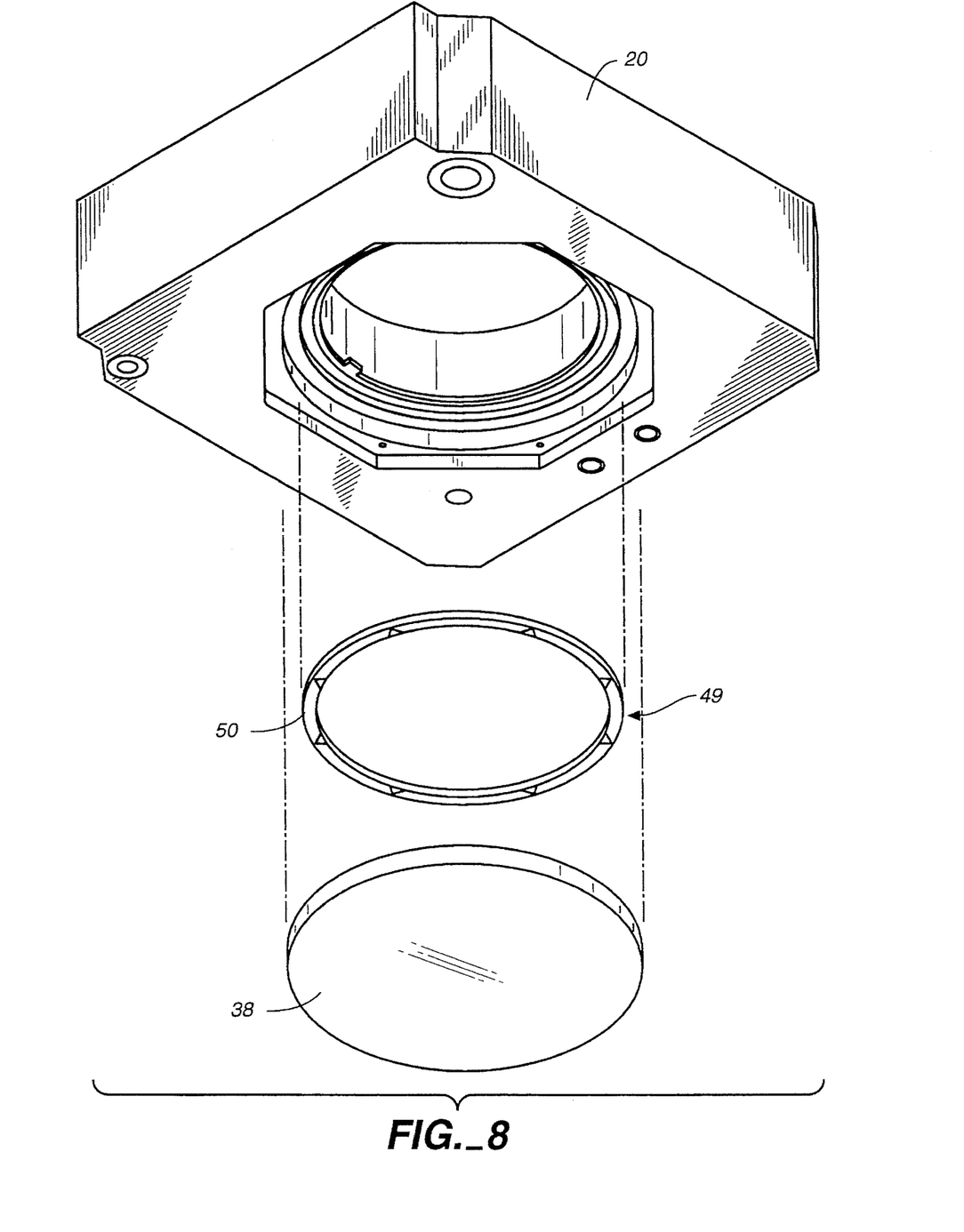
FIG. 8 shows a bottom perspective view of a bottom purge manifold according to the invention being installed into a processing chamber above a fused quartz window.

The ring 50 also includes an outside flange 59 which contacts a second surface 60 adjacent to an outside edge of said bottom purge channel 22. These flanges prevent the bottom purge manifold from sliding too far into the bottom purge channel and assist in sealing the channel. When the top surface of one or more of these flanges 59, 56 contact the fused quartz window 38, the flange's thickness, preferably about 0.018" (0.457 mm), provides spacing for the gas to flow through the hole 62 and out the fan-shaped slot 80. Since the bottom purge manifold 49 is inserted from the bottom as shown in FIG. 8, it needs to be retained in position until it is secured or covered by the fused quartz window 38 or needs to be retained in position during process operations if it is not acting as a spacer with the fused quartz window 38. Because the bottom purge manifold 49 is preferably made of 6061-T6 aluminum, it is preferable that it not contact the window directly, but that the adjacent O-ring 36 provide the contact and sealing. Alternatively, as shown in FIG. 5A, a T-shaped seal member 66, preferably made of a PTFE-type teflon material improves the seal and maintains a predetermined gap between the process chamber wall 20a and window 38 in which the purge gas can flow.

The purge channel 22 has a width of slightly less than 0.250" and a diameter of approximately 8". Because the ring is approximately 8" in diameter and has a nominal thickness of only approximately 0.040" at the central thick portion 53, the ring is very flimsy and during handling may become slightly out of roundness. Such out of roundness of the ring will assist in retaining the ring in its purge channel 22 as the purge channel is precisely circular. The out of round shape of the ring will create a spring load against portions of the walls 78, 79 of the chamber purge channel 22 when the out of round ring is forced into a perfectly round channel.

To assist in retaining the bottom purge manifold 49 in the chamber purge channel 22, a set of circular retaining flanges 71, 72 extend from the thick portion 53 of the flat part of the ring and adjacent to the inner and outer walls 78, 79 of the chamber purge channel 22. These flanges 71, 72 can be configured to provide a spring-load against their adjacent walls 78, 79. The spring force creates a frictional force to resist the retaining flanges and ring from being moved once introduced into the channel 22. To reduce the precision with which the bottom purge manifold must be introduced into the purge channel 22, the retaining flanges 71, 72 can be moved slightly toward the center of the ring and each can be provided with a ridge or hook-type bulge 74, 75 near its end. The bulges 74, 75 have a bevelled leading surface such that the retaining flanges are guided by the leading bevelled surfaces into the center of the chamber purge channel 22. The bulges 74, 75 also act as continuous seals against the inner and outer surfaces 78, 79 of the purge channel 22. Their spring pressure against the channel walls 78, 79 is concentrated along a single line contact which helps resist gas leakage better than the same force applied over a larger area.

The retaining flange 71 has an outer nominal surface 73 above which the bulge 74 protrudes. While the inlet passage 29 of the processing chamber 20 does not coincide with the location of the hole 62 in the bottom purge manifold 49, a set of dashed lines 77 in FIGS. 5 and 5A illustrate the location of the inlet passageway 29 at the location where the passageway 29 meets the chamber purge channel 22.

FIG. 5A shows an exaggerated bending of the retaining flanges 71, 72 such that the bulges 74 clearly are being elastically bent towards the center of the purge channel 22 and as a result exert a spring force against their adjacent walls 78, 79 to provide a frictional force resisting the bottom purge manifold from being displaced. Resisting force is needed in the instance as shown in FIG. 5A where the teflon seal 66 has a larger thickness than the flanges 56, 59 of the bottom purge manifold. In this configuration the purge gas flow includes a flow path away from the center portion 21 of the process chamber toward the seal, but is inhibited from doing so by the small dimension between the continuous top surface 52 of the bottom purge manifold 49 and the top of the fused quartz window 38. The flow within the fan-shaped slot 80 encounters less resistance flowing towards the center portion 21 of the processing chamber.

The thickness of the retaining flanges is about 0.005" and the bulges 74, 75 extend about 0.020" beyond the nominal surface 73 of the retaining flanges 74, 75.

While the invention has been described with regards to specific embodiments, those skilled in the art will recognize that changes can be made in the form and detail without departing from the spirit and scope of the invention.

We claim:

1. A bottom purge manifold for a substrate processing chamber comprising:

a ring configured to obstruct a generally annular bottom purge channel opening of a processing chamber, wherein when said ring is in position obstructing said opening, said ring and said channel are configured to create a series of predefined passages generally equally distributed about said ring from an inside of said annular bottom purge channel to a location outside of said annular bottom purge channel;

wherein a gas disposed at said location outside of said annular bottom purge channel communicates freely with a processing surface of a substrate being processed in the processing chamber;

wherein said ring further comprises a retaining mechanism to assist said ring in maintaining its position the location where said ring obstructs said channel opening;

wherein said retaining mechanism comprises a set of retaining flanges configured to extend into said annular bottom purge channel opening along opposite walls of said opening and further are configured to urge a portion of each of said flanges into its adjacent wall to create a frictional force to assist in preventing said ring from being released from said location where said ring obstructs said channel opening.

2. A bottom purge manifold as in claim 1, wherein each of said retaining flanges includes a bulge which projects beyond a nominal surface of said flange towards its adjacent wall, such that when bulges of both of said flanges contact their respective adjacent walls said flanges are bent to create a force urging said bulge towards its respective wall, thereby assisting to retain said ring in said purge channel.

3. A bottom purge manifold for a substrate processing chamber comprising:

a ring configured to obstruct a generally annular bottom purge channel opening of a processing chamber, wherein when said ring is in position obstructing said opening, said ring and said channel are configured to create a series of predefined passages generally equally distributed about said ring from an inside of said annular bottom purge channel to a location outside of said annular bottom purge channel;

wherein a gas disposed at said location outside of said annular bottom purge channel communicates freely with a processing surface of a substrate being processed in the processing chamber;

wherein said ring includes an inside flange that laps onto a first surface adjacent to an inside edge of said bottom purge channel opening and a second flange that laps onto a second surface adjacent to an outside edge of said bottom purge channel opening;

wherein said ring further comprises a retaining mechanism to assist said ring in maintaining its position at the location where said ring obstructs said channel opening;

wherein said retaining mechanism comprises a set of retaining flanges configured to extend into said annular bottom purge channel opening along opposite walls of said opening and further are configured to urge a portion of each of said flanges into its adjacent wall to create a frictional force to assist in preventing said ring from being released from said location where said ring obstructs said channel opening.

4. A bottom purge manifold as in claim 3, wherein said inside flange has a top surface opposite said first surface;

wherein said outside flange has a top surface opposite a second surface;

wherein said ring includes a central thick portion having a continuous top surface between said inside top surface of said inside flange and said top surface of said outside flange;

wherein said passages pass through said thick portion and create passages generally open to a center portion of said processing chamber and create passages that cause flow restrictions for gas flow emerging from said passages in directions other than toward the center of said processing chamber, such that a substantial portion of the gas flow passing through said passages is directed toward the center portion of said chamber, and a negligible portion of the gas flow passing through said passages is directed in directions other than toward the center portion of said chamber.

5. A bottom purge manifold as in claim 4, wherein each of said passages includes a hole passing through said thick portion, from an inside of said channel to a slot in said thick portion and said inside flange which connects the end of said hole with an inner circumferential surface of said ring.

6. A bottom purge manifold as in claim 3, wherein each of said retaining flanges includes a bulge which projects beyond a nominal surface of said flange towards its adjacent wall, such that when bulges of both of said flanges contact their respective adjacent walls said flanges are bent to create a force urging said bulge towards its respective wall, thereby assisting to retain said ring in said purge channel.

7. A bottom purge manifold as in claim 6, wherein said inside flange has a top surface opposite said first surface;

wherein said outside flange has a top surface opposite a second surface;

wherein said ring includes a central thick portion having a continuous top surface between said inside top surface of said inside flange and said top surface of said outside flange;

wherein said passages pass through said thick portion and create passages generally open to a center portion of said processing chamber and create passages that cause flow restrictions for gas flow emerging from said passages in directions other than toward the center of said processing chamber, such that a substantial portion of the gas flow passing through said passages is directed toward the center portion of said chamber, and a negligible portion of the gas flow passing through said passages is directed in directions other than toward the center portion of said chamber.

8. A bottom purge manifold as in claim 7, wherein each of said passages includes a hole passing through said thick portions from an inside of said channel to a slot in said thick portion and said inside flange which connects the end of said hole with an inner circumferential surface of said ring.

9. A bottom purge manifold for a substrate processing chamber comprising:

a ring configured to obstruct a generally annular bottom purge channel opening of a processing chamber, wherein when said ring is in position obstructing said opening, said ring and said channel are configured to create a series of predefined passages generally equally distributed about said ring from an inside of said annular bottom purge channel to a location outside of said annular bottom purge channel;

wherein a gas disposed at said location outside of said annular bottom purge channel communicates freely with a processing surface of a substrate being processed in the processing chamber;

wherein, said ring includes an inside flange that laps onto a first surface adjacent to an inside edge of said bottom purge channel opening and a second flange that laps onto a second surface adjacent to an outside edge of said bottom purge channel opening;

wherein said inside flange has a top surface opposite said first surface;

wherein said outside flange has a top surface opposite a second surface;

wherein said ring includes a central thick portion having a continuous top surface between said inside top surface of said inside flange and said top surface of said outside flange;

wherein said passages pass through said thick portion and create passages generally open to a center portion of said processing chamber and create passages that cause flow restrictions for gas flow emerging from said passages in directions other than toward the center of said processing chamber, such that a substantial portion of the gas flow passing through said passages is directed toward the center portion of said chamber, and a negligible portion of the gas flow passing through said passages is directed in directions other than toward the center portion of said chamber;

wherein each of said passages includes a hole passing through said thick portion, from an inside of said channel to a slot in said thick portion and said inside flange which connects the end of said hole with an inner circumferential surface of said ring.

10. A bottom purge manifold as in claim 9, wherein said slot is configured like an isosceles triangle having a rounded corner surface generally concentric with said hole, said the equal legs of said triangle being spread at a predetermined angle from one another such that an imaginary base of such a triangle runs along a circumferential path circumscribing the center facing surface of said ring.

11. A bottom purge manifold for a substrate processing chamber comprising:

a ring configured to obstruct a generally annular bottom purge channel opening of a processing chamber, wherein when said ring is in position obstructing said opening, said ring and said channel are configured to create a series of predefined passages generally equally distributed about said ring from an inside of said annular bottom purge channel to a location outside of said annular bottom purge channel;

wherein a gas disposed at said location outside of said annular bottom purge channel communicates freely with a processing surface of a substrate being processed in the processing chamber;

wherein, said ring includes an inside flange that laps onto a first surface adjacent to an inside edge of said bottom purge channel opening and a second flange that laps onto a second surface adjacent to an outside edge of said bottom purge channel opening;

wherein, said series of predefined passages are orifices generally centered in said ring;

wherein said inside flange has a top surface opposite said first surface;

wherein said outside flange has a top surface opposite a second surface;

wherein said ring includes a central thick portion having a continuous top surface between said inside top surface of said inside flange and said top surface of said outside flange;

wherein said passages pass through said thick portion and create passages generally open to a center portion of said processing chamber and create passages that cause flow restrictions for gas flow emerging from said passages in directions other than toward the center of said processing chamber, such that a substantial portion of the gas flow passing through said passages is directed toward the center portion of said chamber, and a negligible portion of the gas flow passing through said passages is directed in directions other than toward the center portion of said chamber;

wherein each of said passages includes a hole passing through said thick portion, from an inside of said channel to a slot in said thick portion and said inside flange which connects the end of said hole with an inner circumferential surface of said ring.

12. A bottom purge manifold for a substrate processing chamber comprising:

a ring configured to obstruct a generally annular bottom purge channel opening of a processing chamber, wherein when said ring is in position obstructing said opening, said ring and said channel are configured to create a series of predefined passages generally equally distributed about said ring from an inside of said annular bottom purge channel to a location outside of said annular bottom purge channel;

wherein a gas disposed at said location outside of said annular bottom purge channel communicates freely with a processing surface of a substrate being processed in the processing chamber;

wherein, said ring includes an inside flange that laps onto a first surface adjacent to an inside edge of said bottom purge channel opening and a second flange that laps onto a second surface adjacent to an outside edge of said bottom purge channel opening;

wherein said ring further comprises a retaining mechanism to assist said ring in maintaining its position at the location where said ring obstructs said channel opening;

wherein said inside flange has a top surface opposite said first surface;

wherein said outside flange has a top surface opposite a second surface;

wherein said ring includes a central thick portion having a continuous top surface between said inside top surface of said inside flange and said top surface of said outside flange;

wherein said passages pass through said thick portion and create passages generally open to a center portion of said processing chamber and create passages that cause flow restrictions for gas flow emerging from said passages in directions other than toward the center of said processing chamber, such that a substantial portion of the gas flow passing through said passages is directed toward the center portion of said chamber, and a negligible portion of the gas flow passing through said passages is directed in directions other than toward the center portion of said chamber;

wherein each of said passages includes a hole passing through said thick portion, from an inside of said channel to a slot in said thick portion and said inside flange which connects the end of said hole with an inner circumferential surface of said ring.

13. A substrate processing chamber, comprising:

an upper chamber containing a processing gas for processing a substrate;

a pedestal holding said substrates and separated from a side wall by a gap;

a lower chamber separated from said upper chamber by said pedestal;

a gas channel groove formed near and surrounding a bottom of said lower chamber and facing a vertical axis of said upper and lower chambers for supplying a purge gas flow from said lower chamber to said upper chamber through said gap to purge said processing gas form said lower chamber; and a manifold cover member removably insertable in said gas channel groove and having a plurality of aperatures formed therethrough for passage of said purge gas into said lower chamber;

wherein said manifold member includes a plurality of fan-shaped recesses extending from respective ones of said apertures to said lower chamber.

14. A substrate processing chamber, comprising:

an upper chamber containing a processing gas for processing a substrate;

a pedestal holding said substrate and separated from a side wall by a gap;

a lower chamber separated from said upper chamber by said pedestal;

a gas channel groove formed near and surrounding a bottom of said lower chamber and facing a vertical axis of said upper and lower chambers for supplying a purge gas flow from said lower chamber to said upper chamber through said gap to purge said processing gas form said lower chamber; and a manifold cover member removably insertable in said gas channel groove and having a plurality of apertures formed therethrough for passage of said purge gas into said lower chamber;

wherein said lower chamber has a lower wall and where said manifold cover member downwardly faces said lower wall with a second gap therebetween;

wherein said lower chamber comprises a side wall in which said gas channel groove is formed in a downwardly facing side wall edge thereof and further comprising a plastic spacer defining a third gap formed between said side wall edge and said lower wall.

15. A substrate processing chamber as recited in claim 14, further comprising an O-ring providing a vacuum seal for said lower chamber and disposed in a groove formed in said side wall edge and contacting said plastic spacer.

* * * * *